United States Patent
Chen et al.

(10) Patent No.: US 8,841,050 B2
(45) Date of Patent: Sep. 23, 2014

(54) PHOTOSENSITIVE RESIN COMPOSITION AND APPLICATIONS THEREOF

(71) Applicant: Chi Mei Corporation, Tainan (TW)

(72) Inventors: Kai-Min Chen, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/027,378

(22) Filed: Sep. 16, 2013

(65) Prior Publication Data
US 2014/0087308 A1    Mar. 27, 2014

(30) Foreign Application Priority Data

Sep. 27, 2012   (TW) .............. 101135627 A

(51) Int. Cl.
*G03F 7/023* (2006.01)
*G03F 7/004* (2006.01)
*G03F 7/075* (2006.01)
*G03F 7/00* (2006.01)

(52) U.S. Cl.
CPC ............ *G03F 7/0757* (2013.01); *G03F 7/0045* (2013.01); *G03F 7/0005* (2013.01); *G03F 7/0755* (2013.01)
USPC .............. 430/18; 430/191; 430/192

(58) Field of Classification Search
None
See application file for complete search history.

(56) References Cited

U.S. PATENT DOCUMENTS

| | | | | |
|---|---|---|---|---|
| 2008/0312400 | A1* | 12/2008 | Yamashita et al. | 528/30 |
| 2011/0183115 | A1* | 7/2011 | Kang et al. | 428/156 |
| 2013/0280541 | A1* | 10/2013 | Wu et al. | 428/447 |
| 2013/0310497 | A1* | 11/2013 | Wu et al. | 524/159 |

FOREIGN PATENT DOCUMENTS

| | | |
|---|---|---|
| CN | 102141732 | 8/2011 |
| JP | 2001-354822 A | 12/2001 |

OTHER PUBLICATIONS

English translation of JP, 2001-354822, A (2001) from machine translation from AIPN Japan Patent Office National center for Industrial Property Information and Training, generated Mar. 18, 2014, 13 pages.*
"Office Action of Taiwan Counterpart Application", issued on May 15, 2014, p. 1-p. 5, in which the listed reference was cited.

* cited by examiner

*Primary Examiner* — Cynthia Hamilton
(74) *Attorney, Agent, or Firm* — Jianq Chyun IP Office

(57) ABSTRACT

A photosensitive resin composition includes: an alkali-soluble resin; an o-naphthoquinonediazidesulfonic acid ester; a silsesquioxane having at least two thiol groups in a molecule; and a solvent. The silsesquioxane is obtained by subjecting to condensation a silane material which includes a thiol-group-containing silane represented by $R^a Si(OR^b)_3$. $R^a$ represents a $C_1$-$C_8$ organic group that contains a thiol group and that is free from an aromatic group, or an organic group that contains a thiol group and an aromatic group. $R^b$ independently represents hydrogen, a $C_1$-$C_6$ alkyl group, a $C_1$-$C_6$ acyl group, or a $C_6$-$C_{15}$ aromatic group.

5 Claims, No Drawings

US 8,841,050 B2

PHOTOSENSITIVE RESIN COMPOSITION AND APPLICATIONS THEREOF

CROSS-REFERENCE TO RELATED APPLICATION

This application claims priority of Taiwanese Patent Application No. 101135627, filed on Sep. 27, 2012.

BACKGROUND OF THE INVENTION

1. Field of the Invention

The invention relates to a photosensitive resin composition, more particularly to a photosensitive resin composition for forming a protective film having a good cross-sectional shape and a low linear thermal expansion coefficient. This invention also relates to a protective film formed from the photosensitive resin composition, and an element containing the protective film.

2. Description of the Related Art

While manufacturing an optical device such as a liquid crystal display or a solid state imaging device, processing procedures such as soaking in acid or alkaline solutions and sputtering, and heat generated during the processing procedures may cause damage to the optical device. Therefore, a protective film is usually needed for protecting the optical device.

The protective film is not only required to have superior resistance to chemicals, water, and solvents so as to provide sufficient protection against the aforementioned conditions, but also to have good adhesion to a substrate, high transparency and good thermal and light resistances so as to alleviate whitening or yellowing problems after being in use for a long period of time.

JP 2001-354822 discloses a radiation-sensitive resin composition for forming a protective film. The radiation-sensitive resin composition includes: (A) a copolymer of an unsaturated carboxylic acid and/or an unsaturated carboxylic acid anhydride, an epoxy-containing unsaturated compound, a maleimide monomer, and other olefinic unsaturated compound; and (B) 1,2-quinonediazide compound, wherein the amount of the 1,2-quinonediazide compound (B) ranges from 5 to 100 parts by weight based on 100 parts by weight of the copolymer (A). Such radiation-sensitive resin composition has good sensitivity and the protective film formed therefrom has good thermal resistance and solvent resistance. However, the protective film has relatively high linear thermal expansion coefficient and inferior cross-sectional shape, thereby adversely affecting accuracy of processes such as forming a wiring electrode layer on the protective film.

Therefore, there is a need in the art to provide a protective film that has a good cross-sectional shape and a low linear thermal expansion coefficient.

SUMMARY OF THE INVENTION

Therefore, a first object of the present invention is to provide a photosensitive resin composition for forming a protective film having a good cross-sectional shape and a low linear thermal expansion coefficient.

A second object of the present invention is to provide a protective film formed from the photosensitive resin composition.

A third object of the present invention is to provide an element containing the protective film.

According to a first aspect of the present invention, a photosensitive resin composition includes (A) an alkali-soluble resin, (B) an o-naphthoquinonediazidesulfonic acid ester, (C) a silsesquioxane having at least two thiol groups in a molecule, and (D) a solvent. The silsesquioxane is obtained by subjecting to condensation a silane material which includes a thiol-group-containing silane represented by formula (I):

$$R^a Si(OR^b)_3 \quad (I),$$

wherein $R^a$ represents a $C_1$-$C_8$ organic group that contains a thiol group and that is free from an aromatic group, or an organic group that contains a thiol group and an aromatic group, and $R^b$ independently represents hydrogen, a $C_1$-$C_6$ alkyl group, a $C_1$-$C_6$ acyl group, or a $C_6$-$C_{15}$ aromatic group.

According to a second aspect of the present invention, there is provided a protective film formed from the photosensitive resin composition.

According to a third aspect of the present invention, there is provided an element including the protective film.

DETAILED DESCRIPTION OF THE PREFERRED EMBODIMENTS

As used herein, the term "(meth)acrylic acid" means acrylic acid and/or methacrylic acid. Likewise, the term "(meth)acryloyl" means acryloyl and/or methacryloyl, and the term "(meth)acrylate" means acrylate and/or methacrylate.

According to the present invention, the photosensitive resin composition includes (A) an alkali-soluble resin, (B) an o-naphthoquinonediazidesulfonic acid ester, (C) a silsesquioxane having at least two thiol groups in a molecule, and (D) a solvent. The silsesquioxane is obtained by subjecting to condensation a silane material which includes a thiol-group-containing silane represented by formula (I):

$$R^a Si(OR^b)_3 \quad (I),$$

wherein $R^a$ represents a $C_1$-$C_8$ organic group that contains a thiol group and that is free from an aromatic group, or an organic group that contains a thiol group and an aromatic group, and $R^b$ independently represents hydrogen, a $C_1$-$C_6$ alkyl group, a $C_1$-$C_6$ acyl group, or a $C_6$-$C_{15}$ aromatic group.

[Alkali-Soluble Resin (A)]

The alkali-soluble resin (A) is a resin that is soluble in an alkali solution, and the chemical structure of the alkali-soluble resin (A) is not limited hereto according to the present invention.

Preferably, the alkali-soluble resin (A) is a carboxyl-containing resin or a phenol-novolac resin.

Preferably, the alkali-soluble resin (A) is obtained by subjecting a mixture to copolymerization in the presence of a polymerization initiator. The mixture can include: (i) an unsaturated carboxylic acid compound and/or an unsaturated carboxylic anhydride compound (a1) and a first unsaturated compound having an epoxy group (a2); (ii) the unsaturated carboxylic acid compound and/or the unsaturated carboxylic anhydride compound (a1), the first unsaturated compound (a2), and a second unsaturated compound (a3) that is different from the unsaturated carboxylic acid compound and/or the unsaturated carboxylic anhydride compound (a1) and the first unsaturated compound (a2); or (iii) the unsaturated carboxylic acid compound and/or the unsaturated carboxylic anhydride compound (a1) and the second unsaturated compound (a3).

<Unsaturated Carboxylic Acid Compound and/or Unsaturated Carboxylic Anhydride Compound (a1)>

The unsaturated carboxylic acid compound and/or the unsaturated carboxylic anhydride compound (a1) may be used in an amount ranging from 5 to 50 parts by weight, preferably from 8 to 45 parts by weight, and more preferably from 10 to 40 parts by weight based on 100 parts by weight of the alkali-soluble resin (A) used in the photosensitive resin composition of the present invention.

The unsaturated carboxylic acid compound and/or the unsaturated carboxylic anhydride compound (a1) may be referred to as a compound having an unsaturated group and a carboxylic group or carboxylic anhydride group. Examples of the unsaturated carboxylic acid compound and/or the unsaturated carboxylic anhydride compound (a1) may include, but are not limited to, an unsaturated monocarboxylic acid compound, an unsaturated dicarboxylic acid compound, an unsaturated carboxylic anhydride compound, a polycyclic unsaturated monocarboxylic acid compound, a polycyclic unsaturated dicarboxylic acid compound, and a polycyclic unsaturated carboxylic anhydride compound.

Examples of the unsaturated monocarboxylic acid compound may include, but are not limited to, (meth)acrylic acid, crotonic acid, α-chloroacrylic acid, ethacrylic acid, cinnamic acid, 2-(meth)acryloyloxyethyl succinate monoester, 2-(meth)acryloyloxyethyl hexahydrophthalate, 2-(meth)acryloyloxyethyl phthalate, and omega-carboxypolycaprolactone polyol monoacrylate (commercially available from TOAGOSEI Co., Ltd, Product name: ARONIX M-5300).

Examples of the unsaturated dicarboxylic acid compound may include, but are not limited to, maleic acid, fumaric acid, methylfumaric acid, itaconic acid, and citraconic acid.

Examples of the unsaturated carboxylic anhydride compound may include, but are not limited to, anhydride compounds of the aforementioned examples of the unsaturated dicarboxylic acid compound.

Examples of the polycyclic unsaturated monocarboxylic acid compound may include, but are not limited to, 5-carboxy-bicyclo[2.2.1]hept-2-ene, 5-carboxy-5-methyl-bicyclo[2.2.1]hept-2-ene, 5-carboxy-5-ethyl-bicyclo[2.2.1]hept-2-ene, 5-carboxy-6-methyl-bicyclo[2.2.1]hept-2-ene, and 5-carboxy-6-ethyl-bicyclo[2.2.1]hept-2-ene.

A non-limiting example of the polycyclic unsaturated dicarboxylic acid compound is 5,6-dicarboxy-bicyclo[2.2.1]hept-2-ene.

A non-limiting example of the polycyclic unsaturated dicarboxylic anhydride compound is an anhydride compound of the aforementioned example of the polycyclic unsaturated dicarboxylic acid compound.

Preferably, the unsaturated carboxylic acid compound and/or the unsaturated carboxylic anhydride compound (a1) is selected from the group consisting of acrylic acid, methacrylic acid, maleic anhydride, 2-methacryloyloxyethyl succinate monoester, 2-methacryloyloxyethyl hexahydrophthalate, and combinations thereof.

<First Unsaturated Compound Having an Epoxy Group (a2)>

The first unsaturated compound having an epoxy group (a2) may be used in an amount ranging from 10 to 70 parts by weight, preferably from 20 to 70 parts by weight, and more preferably from 25 to 65 parts by weight based on 100 parts by weight of the alkali-soluble resin (A) used in the photosensitive resin composition of the present invention.

Examples of the first unsaturated compound having an epoxy group (a2) may include, but are not limited to, epoxy-group-containing (meth)acrylates, epoxy-group-containing α-alkylacrylates, and glycidyl ethers.

Examples of the epoxy-group-containing (meth)acrylates may include, but are not limited to, glycidyl (meth)acrylate, 2-methylglycidyl (meth)acrylate, 3,4-epoxybutyl (meth)acrylate, 6,7-epoxyheptyl (meth)acrylate, 3,4-epoxycyclohexyl (meth)acrylate, and 3,4-epoxycyclohexylmethyl (meth)acrylate.

Examples of the epoxy-group-containing α-alkylacrylates may include, but are not limited to, glycidyl α-ethylacrylate, glycidyl α-n-propylacrylate, glycidyl α-n-butylacrylate, and 6,7-epoxyheptyl α-ethylacrylate.

Examples of the glycidyl ethers may include, but are not limited to, o-vinylbenzylglycidyl ether, m-vinylbenzylglycidyl ether, and p-vinylbenzylglycidyl ether.

Preferably, the first unsaturated compound containing an epoxy group (a2) is selected from the group consisting of glycidyl methacrylate, 3,4-epoxycyclohexylmethyl (meth)acrylate, 6,7-epoxyheptyl methacrylate, o-vinylbenzylglycidyl ether, m-vinylbenzylglycidyl ether, and p-vinylbenzylglycidyl ether.

<Second Unsaturated Compound (a3)>

The second unsaturated compound (a3) may be used in an amount ranging from 0 to 70 parts by weight, preferably from 0 to 60 parts by weight, and more preferably from 0 to 55 parts by weight based on 100 parts by weight of the alkali-soluble resin (A) used in the photosensitive resin composition of the present invention.

Examples of the second unsaturated compound (a3) may include, but are not limited to, alkyl (meth)acrylate, alicyclic (meth)acrylate, aryl (meth)acrylate, unsaturated dicarboxylic acid diester, hydroxyalkyl (meth)acrylate, (meth)acrylate polyether, and aryl vinyl compound.

Examples of the alkyl (meth)acrylate may include, but are not limited to, methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, and tert-butyl (meth)acrylate.

Examples of the alicyclic (meth)acrylate may include, but are not limited to, cyclohexyl (meth)acrylate, 2-methylcyclohexyl (meth)acrylate, dicyclopentanyl (meth)acrylate, dicyclopentyloxyethyl (meth)acrylate, isobornyl (meth)acrylate, and tetrahydrofurfuryl (meth)acrylate.

Examples of the aryl (meth)acrylate may include, but are not limited to, phenyl (meth)acrylate and benzyl (meth)acrylate.

Examples of the unsaturated dicarboxylic acid diester may include, but are not limited to, diethyl maleate, diethyl fumarate, and diethyl itaconate.

Examples of the hydroxyalkyl (meth)acrylate may include, but are not limited to, 2-hydroxyethyl (meth)acrylate, and 2-hydroxypropyl (meth)acrylate.

Examples of the (meth)acrylate polyether may include, but are not limited to, poly(ethylene glycol) mono(meth)acrylate, and poly(propylene glycol) mono(meth)acrylate.

Examples of the aryl vinyl compound may include, but are not limited to, styrene, α-methyl styrene, m-methylstyrene, p-methylstyrene, and p-methoxystyrene.

Examples of the second unsaturated compound (a3) may also include, but are not limited to, acrylonitrile, methacrylonitrile, vinyl chloride, vinylidene chloride, acrylamide, methacrylamide, vinyl acetate, 1,3-butadiene, isoprene, 2,3-dimethyl-1,3-butadiene, N-cyclohexylmaleimide, N-phenylmaleimide, N-benzylmaleimide, N-succinimidyl-3-maleimidobenzoate, N-succinimidyl-4-maleimidobutyrate, N-succinimidyl-6-maleimidohexanoate, N-succinimidyl-3-maleimidopropionate, and N-(9-acridinyl)maleimide.

Preferably, the second unsaturated compound (a3) is selected from the group consisting of methyl (meth)acrylate, butyl (meth)acrylate, 2-hydroxyethyl (meth)acrylate, tert-butyl (meth)acrylate, benzyl (meth)acrylate, dicyclopentanyl (meth)acrylate, dicyclopentyloxyethyl (meth)acrylate, styrene, p-methoxystyrene, and combinations thereof.

Examples of solvents for preparing the alkali-soluble resin (A) may include, but are not limited to:

(1) alcohols, such as methanol, ethanol, benzyl alcohol, 2-phenylethanol, and 3-phenyl-1-propanol;

(2) ethers, such as tetrahydrofuran;

(3) ethylene glycol ethers, such as ethylene glycol monopropyl ether, ethylene glycol monomethyl ether, and ethylene glycol monoethyl ether;

(4) ethylene glycol alkyl ether acetates, such as ethylene glycol butyl ether acetate, ethylene glycol ethyl ether acetate, and ethylene glycol methyl ether acetate;

(5) diethylene glycol ethers, such as diethylene glycol monomethyl ether, diethylene glycol monoethyl ether, diethylene glycol monobutyl ether, diethylene glycol dimethyl ether, diethylene glycol diethyl ether, and diethylene glycol methyl ethyl ether;

(6) dipropylene glycol ethers, such as dipropylene glycol monomethyl ether, dipropylene glycol monoethyl ether, dipropylene glycol dimethyl ether, dipropylene glycol diethyl ether, and dipropylene glycol methyl ethyl ether;

(7) propylene glycol monoalkyl ethers, such as propylene glycol monomethyl ether, propylene glycol monoethyl ether, propylene glycol monopropyl ether, and propylene glycol monobutyl ether;

(8) propylene glycol alkyl ether acetates, such as propylene glycol monomethyl ether acetate, propylene glycol monoethyl ether acetate, propylene glycol monopropyl ether acetate, and propylene glycol monobutyl ether acetate;

(9) propylene glycol alkyl ether propionates, such as propylene glycol monomethyl ether propionate, propylene glycol monoethyl ether propionate, propylene glycol monopropyl ether propionate, and propylene glycol monobutyl ether propionate;

(10) aromatic hydrocarbons, such as toluene and xylene;

(11) ketones, such as methylethyl ketone, cyclohexanone, and diacetone alcohol; and

(12) esters, such as methyl acetate, ethyl acetate, propyl acetate, butyl acetate, ethyl lactate, methyl 2-hydroxy-isobutyrate, ethyl 2-hydroxy-isobutyrate, methyl glycolate, ethyl glycolate, butyl glycolate, methyl lactate, propyl lactate, butyl lactate, methyl 3-hydroxypropanoate, ethyl 3-hydroxypropanoate, propyl 3-hydroxypropanoate, butyl 3-hydroxypropanoate, methyl 2-hydroxy-3-methylbutanoate, methyl methoxyacetate, ethyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, 3-methoxybutyl acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate.

Preferably, the solvent for preparing the alkali-soluble resin (A) is selected from the group consisting of diethylene glycol dimethyl ether, propylene glycol monomethyl ether acetate, and a combination thereof.

The aforesaid examples of the solvent for preparing the alkali-soluble resin (A) can be used alone or as a mixture of two or more.

An initiator for preparing the alkali-soluble resin (A) may include, but is not limited to, azo compounds and peroxide compounds.

Examples of the azo compounds may include, but are not limited to, 2,2'-azobisisobutyronitrile, 2,2'-azobis(2,4-dimethylvaleronitrile), 2,2'-azobis(4-methoxy-2,4-dimethylvaleronitrile), 2,2'-azobis(2-methylbutyronitrile), 4,4'-azobis(4-cyanovaleric acid), dimethyl-2,2'-azobis(2-methylpropionate), and 2,2'-azobis(4-methoxy-2,4-dimethylvaleronitrile).

Examples of the peroxide compounds may include, but are not limited to, benzoyl peroxide, lauroyl peroxide, tert-butyl peroxypivalate, 1,1-di(tert-butylperoxy)cyclohexane, and hydrogen peroxide.

Preferably, the molecular weight of the alkali-soluble resin (A) is adjustable by using a single resin or using two or more resins. Preferably, the molecular weight of the alkali-soluble resin (A) ranges from 3,000 to 100,000, more preferably from 4,000 to 80,000, and even more preferably from 5,000 to 60,000.

[O-Naphthoquinonediazidesulfonic Acid Ester (B)]

There is no particular limitation to the o-naphthoquinonediazidesulfonic acid ester (B) for the photosensitive resin composition according to the present invention. The o-naphthoquinonediazidesulfonic acid ester (B) may be a partially or completely esterified compound. Preferably, the o-naphthoquinonediazidesulfonic acid ester (B) is obtained via a reaction of o-naphthoquinonediazidesulfonic acid or salt thereof with a hydroxyl compound. More preferably, the o-naphthoquinonediazidesulfonic acid ester (B) is obtained via a reaction of o-naphthoquinonediazidesulfonic acid or salt thereof with a polyhydroxyl compound.

Examples of the o-naphthoquinonediazidesulfonic acid may include, but are not limited to, o-naphthoquinonediazide-4-sulfonic acid, o-naphthoquinonediazide-5-sulfonic acid, and o-naphthoquinonediazide-6-sulfonic acid. A non-limiting example of the salt of o-naphthoquinonediazidesulfonic acid may be halide of o-naphthoquinonediazidesulfonic acid.

Examples of the hydroxyl compound may include, but are not limited to:

(1) hydroxybenzophenones: such as 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, and 2,3,4,3',4',5'-hexahydroxybenzophenone.

(2) hydroxyaryl compounds: a nonlimiting example of the hydroxyaryl compound is represented by Formula (a):

$$\text{(a)}$$

wherein $R^m$, $R^n$, and $R^o$ independently represent a hydrogen atom or a $C_1$-$C_6$ alkyl group;

$R^p$, $R^q$, $R^r$, $R^s$, $R^t$, and $R^u$ independently represent a hydrogen atom, a halogen atom, a $C_1$-$C_6$ alkyl group, a $C_1$-$C_6$ alkoxy group, a $C_1$-$C_6$ alkenyl group, or a cycloalkyl group;

$R^v$ and $R^w$ independently represent a hydrogen atom, a halogen atom, or a $C_1$-$C_6$ alkyl group;

x, y, and z independently denote an integer ranging from 1 to 3; and k is 0 or 1.

Examples of the hydroxyaryl compound represented by Formula (a) include, but are not limited to, tri(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-[1,1-bis(3-methyl-4-hydroxyphenyl)ethyl]benzene.

(3) (hydroxyphenyl)hydrocarbons: a non-limiting example of the (hydroxyphenyl)hydrocarbons is represented by Formula (b):

$$\text{(b)}$$

wherein $R^x$ and $R^y$ independently represent a hydrogen atom or a $C_1$-$C_6$ alkyl group; and x' and y' independently represent an integer ranging from 1 to 3.

Examples of the (hydroxyphenyl)hydrocarbon compound represented by Formula (b) may include, but are not limited to, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, and bis(2,4-dihydroxyphenyl)methane.

(4) other aromatic hydroxyl compounds: such as phenol, p-methoxyphenol, dimethylphenol, hydroquinone, bisphenol A, naphthol, pyrocatechol, pyrogallol monomethyl ether, pyrogallol-1,3-dimethyl ether, gallic acid, and partially esterified or partially etherified gallic acid.

The aforesaid examples of the hydroxyl compounds can be used alone or as a mixture of two or more.

Preferably, the hydroxyl compound is selected from the group consisting of 1-[1-(4-hydroxyphenyl)isopropyl]-4-[1,1-bis(4-hydroxyphenyl)ethyl]benzene, 2,3,4-trihydroxybenzophenone, 2,3,4,4'-tetrahydroxybenzophenone, and combinations thereof.

The reaction of o-naphthoquinonediazidesulfonic acid or salt thereof with the hydroxyl compound is often conducted in an organic solvent such as dioxane, N-pyrrolidone, acetamide, and the like, in the presence of an alkali condensation agent such as triethanolamine, alkali carbonate, alkali hydrogen carbonate, and the like.

Preferably, the esterification rate of the o-naphthoquinonediazidesulfonic acid ester (B) is greater than 50%. That is, more than 50% by mole of the hydroxyl groups contained in the hydroxyl compound undergoes an esterification reaction with o-naphthoquinonediazidesulfonic acid or salt thereof, based on 100% by mole of the total hydroxyl groups contained in the hydroxyl compound. More preferably, the esterification rate of the o-naphthoquinonediazide sulfonic acid ester (B) is greater than 60%.

The o-naphthoquinonediazidesulfonic acid ester (B) is used in an amount ranging from 10 parts by weight to 50 parts by weight, preferably from 15 parts by weight to 50 parts by weight, and more preferably from 15 parts by weight to 45 parts by weight based on 100 parts by weight of the alkali-soluble resin (A) used in the photosensitive resin composition according to the present invention.

[Silsesquioxane (C)]

A silsesquioxane (C) has at least two thiol groups in a molecule and is obtained by subjecting to condensation a silane material which includes a thiol-group-containing silane represented by formula (I):

$$R^a Si(OR_b)_3 \qquad \text{(I)}$$

wherein $R^a$ represents a $C_1$-$C_8$ organic group that contains a thiol group and that is free from an aromatic group, or an organic group that contains a thiol group and an aromatic group; and $R^b$ independently represents hydrogen, a $C_1$-$C_6$ alkyl group, a $C_1$-$C_6$ acyl group, or a $C_6$-$C_{15}$ aromatic group.

When the photosensitive resin composition does not contain the silsesquioxane (C) having at least two thiol groups in a molecule, the protective film formed from the photosensitive resin composition has a poor cross-sectional shape and high linear thermal expansion coefficient. Since the thiol group of the silsesquioxane (C) may react with reactive functional groups of other components contained in the photosensitive resin composition, the protective film formed from the photosensitive resin composition has good cross-sectional shape and low linear thermal expansion coefficient. Examples of the reactive functional group may be, but are not limited to, an unsaturated bond, a hydroxyl group, an epoxy group, and combinations thereof.

Preferably, $R^a$ represents a $C_1$-$C_8$ aliphatic hydrocarbon group containing a thiol group, a $C_1$-$C_8$ alicyclic hydrocarbon group containing a thiol group, or a $C_6$-$C_{14}$ aromatic hydrocarbon group containing a thiol group.

In the definition of $R^b$, examples of the alkyl group include, but are not limited to, methyl, ethyl, n-propyl, iso-propyl, n-butyl, and combinations thereof. A non-limiting example of the acyl group is acetyl. A non-limiting example of the aryl group is phenyl.

Thiol-Group-Containing Silane Represented by Formula (I):

Examples of the silane represented by Formula (I) include, but are not limited to, 3-mercaptopropyltrimethoxysilane, 3-mercaptopropyltriethoxysilane, 3-mercaptopropyltriisopropoxysi lane, 3-mercaptopropyltri-n-butoxysilane, 1,4-dimercapto-2-(trimethoxysilyl)butane, 1,4-dimercapto-2-(triethoxysilyl)butane, 1,4-dimercapto-2-(triisopropoxysilyl)butane, 1,4-dimercapto-2-(tributoxysilyl)butane, 2-mercaptomethyl-3-mercaptopropyltrimethoxysilane, 2-mercaptomethyl-3-mercaptopropyltriethoxysilane, 2-mercaptomethyl-3-mercaptoisopropyltripropoxysilane, 2-mercaptomethyl-3-mercaptopropyltri-n-butoxysilane, 1,2-dimercaptoethyltrimethoxysilane, 1,2-dimercaptoethyltriethoxysilane, 1,2-dimercaptoethyltriisopropoxysilane, and 1,2-dimercaptoethyltri-n-butoxysilane. The aforesaid examples of the thiol-group-containing silane represented by Formula (I) may be used alone or in admixture. Preferably, the thiol-group-containing silane represented by Formula (I) is 3-mercaptopropyltrimethoxysilane, that has high reactivity in hydrolysis reaction and is widely available.

Preferably, the silane material further includes a cross-linking compound. The cross-linking compound has an effect to regulate a crosslink density of the silsesquioxane (C). The cross-linking compound is selected from the group consisting of monoalkoxysilane, dialkoxysilane, trialkoxysilane, tetraalkoxysilane, tetraalkoxy titanium, and tetraalkoxy zirconium.

The use of trialkoxysilane can help to regulate the number of thiol group of the silsesquioxane (C). The use of tetraalkoxy titanium or tetraalkoxy zirconium can help to improve a refractive index of a cured product formed from the silsesquioxane (C).

Examples of monoalkoxysilane include, but are not limited to, trimethylmethoxysilane, trimethylethoxysilane, triethylmethoxysilane, triethylethoxysilane, triphenylmethoxysilane, triphenylethoxysilane, and combinations thereof.

Examples of dialkoxysilane include, but are not limited to, dimethyldimethoxysilane, dimethyldiethoxysilane, diethyldimethoxysilane, diethyldiethoxysilane, diphenyldimethoxysilane, diphenyldiethoxysilane, methylphenyldimethoxysilane, methylphenyldiethoxysilane, 3-mercaptopropylmethyldimethoxysilane, and combinations thereof.

Examples of trialkoxysilane include, but are not limited to, methyltrimethoxysilane, methyltriethoxysilane, ethyltrimethoxysilane, ethyltriethoxysilane, phenyltrimethoxysilane, phenyltriethoxysilane, and combinations thereof.

Examples of tetraalkoxysilane include, but are not limited to, tetramethoxysilane, tetraethoxysilane, tetraisopropoxysilane, tetra-n-butoxysilane, and combinations thereof.

Examples of tetraalkoxy titanium include, but are not limited to, tetramethoxy titanium, tetraethoxy titanium, tetraisopropoxy titanium, tetra-n-butoxy titanium, and combinations thereof.

Examples of tetraalkoxy zirconium include, but are not limited to, tetraethoxy zirconium, tetraisopropoxy zirconium, tetra-n-butoxy zirconium, and combinations thereof.

In addition to tetraalkoxy titanium and tetraalkoxy zirconium, other metal alkoxides may be used.

Preparation of Silsesquioxane (C):

1. Hydrolysis Process:

A catalyst can be added while the silane material undergoes a hydrolysis process. There is no particular limitation to the catalyst for hydrolysis, and the general catalyst can be used. Preferably, the catalyst is formic acid that has high catalyst activity and can facilitate a condensation reaction.

The catalyst is used in an amount ranging preferably from 0.1 to 25 parts by weight, and more preferably from 1 to 10 parts by weight based on 100 parts by weight of the silane material. When the amount of the catalyst is above 0.1 part by weight, the silane material can be hydrolyzed sufficiently. When the amount of the catalyst is below 25 parts by weight, the storage stability of the silsesquioxane (C) is better, and the catalyst is easily removed in subsequent steps.

The reaction temperature and the reaction time for the hydrolysis reaction are adjusted depending on a reactivity of the selected silane material. The reaction temperature for the hydrolysis reaction ranges preferably from 0° C. to 100° C. and more preferably from 20° C. to 60° C. Preferably, the reaction time for the hydrolysis reaction ranges from 1 minute to 2 hours.

A solvent may or may not be used in the hydrolysis process depending on the reactivity of the silane material. For example, if the reactivity of the silane material is low, then the solvent is not used. There is no particular limitation to the solvent. Examples of the solvent include, but are not limited to, methanol, ethanol, n-propanol, isopropanol, n-butanol, isobutanol, 2-methyl-2-propanol, acetone, methyl ethyl ketone, methyl isobutyl ketone, diacetone alcohol, propylene glycol monomethyl ether, propylene glycol methyl ether acetate, tetrahydrofuran, dioxacyclohexane, acetonitrile, and combinations thereof. Preferably, the solvent used in the hydrolysis process is the same one used in the condensation process.

2. Condensation Process:

Considering that the condensation occurs between the hydroxyl groups generated by hydrolysis and between the hydroxyl groups and the alkoxy groups unreacted after hydrolysis, the hydrolysis reaction is conducted such that the ratio of a molar number of the hydroxyl group generated by hydrolysis to a molar number of total alkoxy groups in the silane material is preferably above 0.5 and more preferably above 0.8. During the condensation process, water is generated via a reaction between the hydroxyl groups generated by hydrolysis, and alcohol is generated via a reaction between the unreacted alkoxy groups after hydrolysis and the hydroxyl groups. The silsesquioxane (C) having at least two thiol groups in a molecule is generated and is vitrified.

The catalyst may be added during the condensation process. There is no particular limitation to the catalyst, and the general catalyst can be used. Preferably, the catalyst is formic acid that has high catalyst activity so that it can serve as the catalyst for both hydrolysis and condensation. The reaction temperature and the reaction time for the condensation are adjusted depending on the reactivity of the selected silane material. The reaction temperature ranges preferably from 40° C. to 150° C. and more preferably from 60° C. to 100° C. The reaction time ranges preferably 30 minutes to 12 hours.

The condensation reaction is conducted such that a ratio of a total molar number of the unreacted hydroxyl groups and the unreacted alkoxy groups to a molar number of total alkoxy groups in the silane material is preferably below 0.3 and more preferably below 0.2. The aforementioned ratio is used in order to prevent the unreacted hydroxyl groups and the unreacted alkoxy groups from condensing after the silsesquioxane (C) is formed, which may cause gelation during storage, and to prevent the silsesquioxane (C) from further condensing after curing, which may cause cracking.

In the condensation process, the concentration of the silane material ranges preferably from 2 wt % to 80 wt % and more preferably from 15 wt % to 60 wt %. This can prevent gelation during the condensation process and prevent excess molecular weight of the silsesquioxane (C) so as to improve storage stability of the silsesquioxane (C).

Preferably, when the condensation process is conducted, the solvent that is used has a boiling point higher than that of water and alcohol generated from condensation so as to remove the water and alcohol easily. The solvent may be used alone or in admixture. Preferably, the catalyst is removed after the condensation process so as to improve storage stability of the silsesquioxane (C). There is no particular limitation to the method for removing the catalyst, and any appropriate method well known in the art may be chosen depending on the specific catalyst used in the condensation process. Examples of the method for removing the catalyst include, but are not limited to, heating above the boiling point of the catalyst, or reducing the pressure. When the catalyst is formic acid, it can be removed easily by any of the aforementioned methods.

Commercially available products of the silsesquioxane (C) having at least two thiol groups in a molecule may include, but are not limited to, COMPOCERAN SQ-101, COMPOCERAN SQ-102, COMPOCERAN SQ-102-1, COMPOCERAN SQ-103, COMPOCERAN SQ105, COMPOCERAN SQ105-1, and COMPOCERAN SQ105-7 available from Arakawa Chemical Industries, Ltd.

The silsesquioxane (C) is used in an amount ranging from 0.5 to 20 parts by weight, preferably from 1 to 15 parts by weight, and more preferably from 3 to 15 parts by weight based on 100 parts by weight of the alkali-soluble resin (A) used in the photosensitive resin composition according to the present invention.

[Solvent (D)]

There is no particular limitation to the solvent (D) for the photosensitive resin composition of the present invention so long as the solvent (D) can dissolve other components in the photosensitive resin composition and is highly volatile so as to be evaporated easily under atmospheric pressure with a small amount of provided heat. Preferably, the solvent (D) has a boiling temperature that is lower than 150° C. under atmospheric pressure. Examples of the solvent (D) may include, but are not limited to:

(i) aromatic solvents, such as benzene, toluene, and xylene;

(ii) alcohols, such as methanol and ethanol;

(iii) ethers, such as ethylene glycol monopropyl ether, diethylene glycol dimethyl ether, tetrahydrofuran, ethylene glycol monomethyl ether, ethylene glycol monoethyl ether, diethylene glycol methyl ether, diethylene glycol ethyl ether, and diethylene glycol butyl ether;

(iv) esters, such as ethylene glycol monomethyl ether acetate, ethylene glycol monoethyl ether acetate, propylene glycol monomethyl ether acetate, propylene glycol monoethyl ether acetate, propylene glycol monopropyl ether acetate, and ethyl 3-ethoxypropionate (abbreviated as EEP); and (v) ketones, such as methyl ethyl ketone, and acetone.

Preferably, the solvent (D) is selected from the group consisting of diethylene glycol dimethyl ether, propylene glycol monomethyl ether acetate, ethyl 3-ethoxypropionate, and combinations thereof in consideration of the storage stability of the photosensitive resin composition of the present invention.

Preferably, the solvent (D) is used in an amount ranging generally from 100 parts by weight to 800 parts by weight, preferably from 150 parts by weight to 750 parts by weight, and more preferably from 200 parts by weight to 600 parts by weight based on 100 parts by weight of the alkali-soluble resin (A) used in the photosensitive resin composition according to the present invention.

[Additives (E)]

The photosensitive resin composition of the present invention may optionally include additives (E). Examples of the additives (E) may include, but are not limited to, a filler, a polymer other than the alkali-soluble resin (A), a UV absorber, a anticoagulant, a surfactant, an adhesion promoter, a stabilizer, a thermal resistance enhancer, a curing accelerator, and combinations thereof.

There is no specific limitation for the filler. Preferably, the filler is aluminum or a glass material.

Preferably, the polymer other than the alkali-soluble resin (A) is polyvinyl alcohol, polyethylene glycol monoalkyl ether, or polyfluoroalkyl acrylate.

As for the UV absorber, there is no specific requirement for the species thereof. Preferably, the UV absorber is 2-(3-tert-butyl-5-methyl-2-hydroxyphenyl)-5-chlorophenyl azide or alkoxy phenyl ketone.

Preferably, the anticoagulant is, but not limited to, sodium polyacrylate.

Examples of the surfactant may include, but are not limited to, a fluorine surfactant or a silicone surfactant which may be used alone or in combination. The surfactant is used to enhance the coating property of the photosensitive resin composition of the present invention.

Preferably, the fluorine surfactant is a compound having a fluoroalkyl or fluoroalkenyl group at a terminal, main chain, and side chain. Examples of the fluorine surfactant may include, but are not limited to, 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2,-tetrafluorobutyl)ether, hexapropylene glycol (1,1,2,2,3,3-hexafluoropentyl)ether, sodium perfluorododecyl sulfate, 1,1,2,2,8,8,9,9,10,10-decafluorododecane, 1,1,2,2,3,3-hexafluorodecane, sodium fluoroalkylbenzene sulfonate, sodium fluoroalkyl phosphonate, sodium fluoroalkylcarboxylate, fluoroalkylpolyoxyethylene ether, diglycerin tetrakis(fluoroalkylpolyoxyethylene ether), fluoroalkylammonium iodide, fluoroalkylbetain, fluoroalkylpoly(propylene oxide) ether, perfluoroalkylpoly(propylene oxide) ether, and perfluoroalkyl alkanol.

Commercially available products of the fluorine surfactant include BM-1000 and BM-1100 available from BM CHEMIE Co., Ltd.; Megafac F142D, Megafac F172, Megafac F173, Megafac F183, Megafac F178, Megafac F191, Megafac F471 and Megafac F476 available from Dainippon Ink and Chemicals Inc.; Fluorad FC170C, Fluorad FC-171, Fluorad FC-430 and Fluorad FC-431 available from Sumitomo 3M Limited; Surflon S-112, Surflon S-113, Surflon S-131, Surflon S-141, Surflon S-145, Surflon S-382, Surflon SC-101, Surflon SC-102, Surflon SC-103, Surflon SC-104, Surflon SC-105 and Surflon SC-106 available from Asahi Glass Co., Ltd.; F-TOP EF301, F-TOP EF303, and F-TOP EF352 available from Shin Akita Kasei Co., Ltd.; and Ftergent FT-100, FT-110, FT-140A, FT-150, FT-250, FT-251, FTX-251, FTX-218, FT-300, FT-310, and FT-400S available from NEOS Co., Ltd.

Commercially available products of the silicone surfactant include, but are not limited to, Toray Silicon DC3PA, DC7PA, SH11PA, SH21PA, SH28PA, SH29PA, SH30PA, SH-190, SH-193, SZ-6032, SF-8427, SF-8428, DC-57, and DC-190 available from Dow Corning Toray Silicone Co., Ltd.; and TSF-4440, TSF-4300, TSF-4445, TSF-4446, TSF-4460, and TSF-4452 available from GE Toshiba Silicone Co., Ltd.

Other than the fluorine surfactant and the silicone surfactant, examples of the surfactant which can be used in the photosensitive resin composition of the present invention can also include: (i) polyoxyethylene alkylethers, such as polyoxyethylene lauryl ether, polyoxyethylene stearyl ether, and polyoxyethylene oleyl ether; (ii) polyoxyethylene aryl ethers, such as polyoxyethylene n-octylphenyl ether and polyoxyethylene n-nonylphenol ether; (iii) polyoxyethylene dialkylesters, such as polyoxyethylene dilaurate and polyoxyethylene distearate; and (iv) non-ionic surfactants, such as KP341 available from Shietsu Chemical Co., Ltd., and Polyflow No. 57 and Polyflow No. 95 available from Kyoeisya Chemical Co., Ltd.

The adhesion promoter can be used for further improving adhesion of the protective film made from the photosensitive resin composition of the present invention to a substrate. The adhesion promoter may include, but is not limited to, functional silane compounds which preferably contain a carboxyl group, an alkenyl group, an isocynate group, an epoxy group, an amino group, a mercapto group, or halogen. Examples of the silane compound may include, but are not limited to, p-hydroxyphenyltrimethoxysilane, 3-methacryloxypropyltrimethoxysilane, 3-acryloxypropyltrimethoxysilane, vinyltriacetoxysilane, vinyltrimethoxysilane, vinyltriethoxysilane, vinyltri(2-methoxyethoxy)silane, γ-isocyanatopropyltriethoxysilane, 3-glycidylpropyltrimethyoxysilane (such as KBM403, commercially available from Shietsu Chemical Co., Ltd.), 2-(3,4-epoxycyclohexyl)ethyltrimethoxysilane, 3-glycidylpropyldimethylmethoxysilane, 3-amimopropyltrimethoxysilane, N-(2-aminoethyl)-3-aminopropyltrimeth oxysilane, N-(2-aminoethyl)-3-aminopropylmethyldimethoxysilane, 3-mercaptopropyltrimethoxysilane, 3-chloropropyltrimethoxysilane, and 3-chloropropylmethyldimethoxysilane. The aforementioned examples can be used alone or in a mixture of two or more.

The stabilizer may include sulfides, quinones, hydroquinones, polyoxy compounds, amines, nitro compounds, nitroso compounds, and the like. Examples of the stabilizer may include, but are not limited to, 4-methoxyphenol, N-nitroso-N-phenylhydroxylamine aluminum, 2,2'-thio-bis(4-methyl-6-tert-butylphenol), and 2,6-di-tert-butylphenol.

The thermal resistance enhancer may include an N-(alkoxymethyl)glycoluril compound, an N-(alkoxymethyl)melamine compound, and the like. Examples of the N-(alkoxymethyl)glycoluril compound may include, but are not limited to, N,N,N',N'-tetra(methoxymethyl)glycoluril, N,N,N',N'-tetra(ethoxymethyl)glycoluril, N,N,N',N'-tetra(n-propoxymethyl)glycoluril, N,N,N',N'-tetra(i-propoxymethyl)glycoluril, N,N,N',N'-tetra(n-butoxymethyl)glycoluril, and N,N,N',N'-tetra(t-butoxymethyl)glycoluril, and is preferably N,N,N',N'-tetra(methoxymethyl)glycoluril. Examples of the N-(alkoxymethyl)melamine compound may include, but are not limited to, N,N,N',N',N'',N''-hexa(methoxymethyl)melamine, N,N,N',N',N'',N''-hexa(ethoxymethyl)melamine, N,N,N',N',N'',N''-hexa(n-propoxymethyl)melamine, N,N,N',N',N'',N''-hexa(i-propoxymethyl)melamine, N,N,N',N',N'',N''-hexa(n-butoxymethyl)melamine, and N,N,N',N',N'',N''-hexa(t-butoxymethyl)melamine, and is preferably N,N,N',N',N'',N''-hexa(methoxymethyl)melamine. Commercially available products of the N-(alkoxymethyl)melamine compound include NIKARAKKU N-2702 and MW-30M available from Sanwa chemical Co., Ltd.

The curing accelerator is adopted for lowering the linear thermal expansion coefficient of the products made from the photosensitive resin composition according to the present invention. Examples of the curing accelerator may include, but are not limited to: (1) an urethane (meth)acrylate compound having at least one (meth)acryloyl group: commercially available products of which may include, but are not limited to, Art Resin UN-3320HC and Art Resin UN-3320HS available from Negami Industry Co., Ltd.; NK Oligo U-6HA available from Shin-Nakamura Chemical Industry Co., Ltd.; Shiko UV-1700B and Shiko UV-7605B available from Nippon Synthetic Chemical Industry Co., Ltd.; (2) an epoxy-containing compound, for example, but not limited to, bisphenol diglycidyl ethers, such as bisphenol A diglycidyl ether, bisphenol F diglycidyl ether, bisphenol S diglycidyl ether, hydrogenated bisphenol A diglycidyl ether, hydrogenated bisphenol F diglycidyl ether, hydrogenated bisphenol AD diglycidyl ether, brominated bisphenol A diglycidyl ether, brominated bisphenol F diglycidyl ether, and brominated bisphenol S diglycidyl ether; (3) guanamines, such as melamine, acetoguanamine, and benzoguanamine; (4) amines, such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; and (5) imidazole derivatives and salts thereof, such as, imidazole, 2-methyl imidazole, 2-ethyl imidazole, 2-ethyl-4-methyl imidazole, 2-phenyl imidazole, 4-phenyl imidazole, 1-cyanoethyl-2-ethyl imidazole, and 1-(2-cyanoethyl)-2-ethyl-4-methyl imidazole.

The amount of the additives (E) used in the photosensitive resin composition of the present invention may be adjusted based on the knowledge of people having ordinary skill in the art, so long as the intended properties of the photosensitive resin composition are not impaired. The amount of the additives (E) used in the photosensitive resin composition ranges preferably from 0 to 30 parts by weight, more preferably from 0 to 25 parts by weight, and even more preferably from 0 to 20 parts by weight based on 100 parts by weight of the alkali-soluble resin (A) used in the photosensitive resin composition.

To prepare the photosensitive resin composition according to the present invention, the alkali-soluble resin (A), the o-naphthoquinonediazidesulfonic acid ester (B), the silsesquioxane (C), the solvent (D), and optionally the additives (E) are placed into a stirrer and are stirred until a uniform solution is formed.

A protective film of the present invention is formed by coating the photosensitive resin composition onto a substrate, followed by pre-baking, exposing, developing, and post-baking treatments.

The photosensitive resin composition is applied onto the substrate by spray-coating, roller-coating, spin-coating, slit-coating, bar-coating, or the like (preferably spin-coating or slit-coating), and then is subjected to the pre-baking treatment to remove the solvent therein so as to form a prebaked film. The conditions of the pre-baking treatment depend on the types and the formulating ratio of the components in the photosensitive resin composition according to the present invention. However, the prebaking treatment is usually conducted at a temperature ranging from 60° C. to 110° C. for 30 seconds to 15 minutes. Preferably, the prebaked film has a thickness ranging from 3 to 6 µm.

After the pre-baking treatment, the prebaked film is subjected to the exposing treatment via a photomask by using, for example, UV light, far-UV light, X ray, charged particle beam, or the like. For example, the UV light may be g-line (wavelength of 436 nm), h-line, or i-line (wavelength of 365 nm), the far-UV light may be KrF excimer laser, the X ray may be synchrotron radiation, and the charged particle beam may be an electron beam. Preferably; the UV light is adopted, and more preferably, the g-line or the i-line is adopted. Examples of a device for providing the UV light may include, but are not limited to, a high pressure mercury lamp, an ultra-high pressure mercury lamp, and a metal halide lamp. Preferably, the exposure dose ranges from 50 to 1500 J/m².

After the exposing treatment, the developing treatment is conducted by immersing the prebaked film into a developing solution for 30 seconds to 2 minutes, so as to obtain a developed film that is formed with a desired pattern. Examples of the developing solution include: (1) inorganic alkali compounds, such as sodium hydroxide, potassium hydroxide, sodium carbonate, sodium silicate, sodium metasilicate, and ammonia; (2) primary aliphatic amines, such as ethylamine, and n-propylamine; (3) secondary aliphatic amines, such as diethylamine, and di(n-propyl)amine; (4) tertiary aliphatic amines, such as trimethylamine, N,N-diethylmethylamine, 1N,N-dimethylethylamine, and triethylamine: (5) tertiary alicyclic acids, such as pyrrole, piperidine, N-methyl piperidine, N-methyl-1,8-diazabicyclo[5.4.0]undec-7-ene, and 1,5-diazabicyclo[4.3.0]non-5-ene; (6) tertiary aromatic amines, such as pyridine, methylpyrimidine, dimethylpyridine, and quinoline; and (7) quaternary ammonium alkali compounds, such as an aqueous tetramethylammonium hydroxide solution and an aqueous tetraethylammonium hydroxide solution.

Moreover, water-soluble organic solvents and/or surfactants, such as methanol and ethanol, may be optionally added into the developing solution, and examples of the method of the developing treatment may include, but are not limited to, puddle developing, impregnation developing (with or without sonication), and rinse developing.

The developing solution is removed by rinsing the developed film on the substrate with water, followed by drying with compressed air or nitrogen gas. Preferably, a post-exposure treatment is conducted using a high pressure mercury lamp for decomposing the residue of the o-naphthoquinonediazidesulfonic acid ester (B) in a developed film. More preferably, the exposure dose of the post-exposure treatment ranges from 2000 to 5000 J/m².

Thereafter, the post-baking treatment is conducted via a heating device, such as a heating plate or an oven, with a temperature ranging from 120° C. to 250° C., so as to form the protective film of the present invention. The baking period of the post-baking treatment may vary depending on the heating device. As for the heating plate, the heating time of the post-baking treatment ranges from 5 minutes to 30 minutes. As for the oven, the heating time of the post-baking treatment ranges from 30 minutes to 90 minutes.

Examples of the substrate suitable for the present invention include an alkali-free glass, a soda-lime glass, a Pyrex glass, a quartz glass, a glass coated with a transparent conductive film thereon, and the like, which is commonly used in a liquid crystal display; and a photoelectric conversion substrate (for example, a silicon substrate) used in a solid-state image sensor.

An element including the substrate and the protective film formed from the photosensitive resin composition of the present invention can be used in a display device, a semiconductor device, an optical waveguide device, and the like.

The following examples are provided to illustrate the preferred embodiments of the invention, and should not be construed as limiting the scope of the invention.

EXAMPLES

Preparation of Alkali-Soluble Resin (A)

Synthesis Example A-1

A 1000 ml four-necked flask, which is equipped with a nitrogen inlet, a stirrer, a heater, a condenser, and a thermometer, was introduced with nitrogen gas and was added with methacrylic acid (referred as MMA, 10 parts by weight), glycidyl methacrylate (referred as GMA, 65 parts by weight), dicyclopentanyl methacrylate (referred as FA-513M, 15 parts by weight), styrene (referred as SM, 10 parts by weight), and diethylene glycol dimethyl ether as a solvent (referred as Diglyme, 240 parts by weight) to form a mixture.

When the four-necked flask was filled with nitrogen gas, the mixture was stirred and heated up to 85° C. in an oil bath. A catalyst solution (3.0 parts by weight of 2,2'-azobis(2,4-dimethylvaleronitrile)(referred as ADVN) dissolved in 20 parts by weight of Diglyme) was divided into 5 parts and was added sequentially into the four-necked flask part by part within an hour for inducing a polymerization reaction. The polymerization reaction was then conducted at 70° C. for 5 hours. After the polymerization reaction was completed, the product was taken out of the flask, followed by devolatilizing the solvent, so as to obtain an alkali-soluble resin (A-1).

Synthesis Example A-2

A 1000 ml four-necked flask, which is equipped with a nitrogen inlet, a stirrer, a heater, a condenser, and a thermometer, was introduced with nitrogen gas and was added with 2-methacryloyloxyethyl succinate monoester (referred as HOMS, 40 parts by weight), 3,4-epoxycyclohexylmethyl methacrylate (referred as EC-MAA, 25 parts by weight), 2-hydroxyethyl methacrylate (referred as HEMA, 5 parts by weight), FA-513M (10 parts by weight), SM (20 parts by weight), and propylene glycol monomethyl ether acetate as a solvent (referred as PGMEA, 240 parts by weight) to form a mixture.

When the four-necked flask was filled with nitrogen gas, the mixture was stirred and heated up to 85° C. in an oil bath. A catalyst solution (2.4 parts by weight of ADVN dissolved in 20 parts by weight of PGMEA) was divided into 5 parts and was added sequentially into the four-necked flask part by part within one hour for inducing a polymerization reaction. The polymerization reaction was then conducted at 70° C. for 6 hours. After the polymerization reaction was completed, the product was taken out of the flask, followed by devolatilizing the solvent, so as to obtain an alkali-soluble resin (A-2).

Synthesis Example A-3

A 1000 ml four-necked flask, which is equipped with a nitrogen inlet, a stirrer, a heater, a condenser, and a thermometer, was introduced with nitrogen gas and was added with MMA (25 parts by weight), GMA (20 parts by weight), EC-MMA (20 parts by weight), HEMA (10 parts by weight), FA-513M (10 parts by weight), benzyl methacrylate (referred as BzMA, 15 parts by weight), Diglyme (as a solvent, 200 parts by weight), and PGMEA (as a solvent, 40 parts by weight) to form a mixture.

When the four-necked flask was filled with nitrogen gas, the mixture was then stirred and heated up to 85° C. under an oil bath. A catalyst solution (3 parts by weight of 2,2'-azobis(2-methylbutyronitrile) (referred as AMBN) dissolved in 20 parts by weight of Diglyme) was divided into 5 parts and was added sequentially into the four-necked flask part by part within an hour for inducing a polymerization reaction. The polymerization reaction was conducted at 70° C. for 5 hours. After the polymerization reaction was completed, the product was taken out of the flask, followed by devolatilizing the solvent so as to obtain an alkali-soluble resin (A-3).

Preparation of Photosensitive Resin Composition

Example 1

A 500 ml three-necked flask was added with the alkali-soluble resin (A-1) (100 parts by weight), an o-naphthoquinonediazidesulfonic acid ester (DPAP200, commercially available from DKC with 67% of average degree of esterification, 30 parts by weight) that is obtained from reacting o-naphthoquinonediazide-5-sulfonic acid with 1-[1-(4-hydroxyphenyl)isopropyl]-4-[1,1-bis(4-hydroxyphenyl)ethyl]benzene, COMPOCERAN SQ-101 (10 parts by weight, commercially available from Arakawa Chemical Industries, Ltd.), and PGMEA (400 parts by weight). Stirring was conducted using a shaker so as to obtain a photosensitive resin composition. The photosensitive resin composition was subjected to the following evaluations and the results are listed in Table 2.

Examples 2 to 8 and Comparative Examples 1 to 3

The method for preparing the photosensitive resin composition of each of Examples 2 to 8 and Comparative Examples 1 to 3 was similar to that of Example 1. The only difference resides in the components and the amounts thereof in the photosensitive resin composition, which are shown in Table 2. The photosensitive resin composition of each of Examples 2 to 8 and Comparative Examples 1 to 3 was subjected to the following evaluations and the results are listed in Table 2.

Preparation of Patterned Protective Film

Application Example 1

The photosensitive resin composition of Example 1 was spin-coated onto a 100×100×0.7 mm$^3$ glass substrate to obtain a coated film that has a thickness of about 2 Thereafter, the coated film was prebaked at 110° C. for 2 minutes, followed by being exposed with UV of 200 mJ/cm$^2$ exposure dose (AG500-4N, manufactured by M&R Nano Technology) through a pattern mask and immersing in a developing solution (0.4 wt % of tetramethylammonium hydroxide) at 23° C. for one minute to remove the exposed part of the coated film. The coated film was then rinsed with water, exposed with UV again with an exposure dose of 300 mJ/cm$^2$ and post-baked at 230° C. for 60 minutes, so as to obtain a patterned protective film.

Application Examples 2 to 8 and Comparative Application Examples 1 to 3

The method for preparing the patterned protective film of each of Application Examples 2 to 8 and Comparative Application Examples 1 to 3 was similar to that of Application Example 1. The only difference resides in that the photosensitive resin compositions of Examples 2 to 8 and Comparative Example 1 to 3 were used, respectively.

Evaluation Methods

1. Cross-Sectional Shape:

The patterned protective film of each of the Application Examples and Comparative Application Examples was subjected to investigation using Scanning electron microscope (SEM), and the cross-sectional shape of the patterned protective film was evaluated by the following standards:

◎: Rectangular shape, i.e., ■ ;

○: Frustoconical shape, i.e., ▲ ; and

X: Semicircular shape, i.e., ◆, or inverted frustoconical shape, i.e., ▼.

2. Linear Thermal Expansion Coefficient ($\alpha$):

The linear thermal expansion coefficient of the protective film of each of the Application Examples and the Comparative Application Examples was measured at a temperature ranging from 100 to 200° C. using a thermal mechanical analyzer (TMA, manufactured by SEIKO instruments Inc., Model: TMA120C) and was evaluated by the following standards:

◎: $\alpha < 200$

○: $200 \leq \alpha < 300$

X: $\alpha \geq 300$

TABLE 1

| | Compound (parts by weight, pbw) | | | | | | | | Solvent | | Catalyst | | Reaction | Reaction |
| | (a1) | | (a2) | | | (a3) | | | (pbw) | | (pbw) | | Temperature | time |
| | MAA | HOMS | GMA | EC-MAA | HEMA | FA-513M | BzMA | SM | Diglyme | PGMEA | AMBN | ADVN | (° C.) | (hr) |
| A-1 | 10 | 0 | 65 | 0 | 0 | 15 | 0 | 10 | 240 | 0 | 0 | 3.0 | 70 | 5 |
| A-2 | 0 | 40 | 0 | 25 | 5 | 10 | 0 | 20 | 0 | 240 | 0 | 2.4 | 70 | 6 |
| A-3 | 25 | 0 | 20 | 20 | 10 | 10 | 15 | 0 | 200 | 40 | 3.0 | 0 | 70 | 5 |

MAA Methacrylic acid
HOMS 2-methacryloyloxyethyl succinate monoester
GMA glycidyl methacrylate
EC-MAA 3,4-epoxycyclohexylmethyl methacrylate
HEMA 2-hydroxyethyl methacrylate
FA-513M dicyclopentanyl methacrylate
BzMA benzyl methacrylate
SM styrene
Diglyme diethylene glycol dimethyl ether
PGMEA propylene glycol monomethyl ether acetate
AMBN 2,2'-azobis(2-methylbutyronitrile)
ADVN 2,2'-azobis(2,4-dimethylvaleronitrile)

TABLE 2

| Components (Parts by weight) | | Examples | | | | | | | | Comparative Examples | | |
|---|---|---|---|---|---|---|---|---|---|---|---|---|
| | | 1 | 2 | 3 | 4 | 5 | 6 | 7 | 8 | 1 | 2 | 3 |
| Alkali-soluble Resin (A) | A-1 | 100 | 0 | 0 | 100 | 0 | 0 | 100 | 50 | 100 | 0 | 0 |
| | A-2 | 0 | 100 | 0 | 0 | 100 | 0 | 0 | 50 | 0 | 0 | 100 |
| | A-3 | 0 | 0 | 100 | 0 | 0 | 100 | 0 | 0 | 0 | 100 | 0 |
| O-Naphthoquinonediazidesulfonic Acid Ester (B) | B-1 | 30 | 0 | 10 | 10 | 50 | 20 | 20 | 10 | 30 | 30 | 0 |
| | B-2 | 0 | 20 | 0 | 30 | 0 | 0 | 5 | 5 | 0 | 0 | 30 |
| Silsesquioxane (C) which has at least two thiol groups in a molecule | C-1 | 10 | 0 | 0 | 15 | 0 | 3 | 10 | 0 | 0 | 0 | 0 |
| | C-2 | 0 | 5 | 0 | 0 | 5 | 0 | 10 | 0 | 0 | 0 | 0 |
| | C-3 | 0 | 0 | 0.5 | 0 | 5 | 0 | 0 | 3 | 0 | 0 | 0 |
| Silsesquioxane (C) which has no thiol groups in a molecule | C-4 | 0 | 0 | 0 | 0 | 0 | 0 | 0 | 0 | 0 | 0 | 5 |
| Solvent (D) | D-1 | 400 | 0 | 100 | 200 | 600 | 400 | 0 | 200 | 300 | 0 | 400 |
| | D-2 | 0 | 200 | 0 | 0 | 200 | 0 | 400 | 100 | 0 | 300 | 0 |
| | D-3 | 0 | 0 | 0 | 100 | 0 | 0 | 0 | 0 | 0 | 0 | 0 |
| Additives (E) | E-1 | 0 | 0 | 0.1 | 0 | 0 | 0 | 0 | 0 | 0 | 0 | 0 |
| | E-2 | 0 | 0 | 0 | 0 | 0.5 | 0 | 0 | 0 | 0 | 0 | 0 |
| | E-3 | 0 | 10 | 0 | 0 | 0 | 15 | 0 | 0 | 0 | 0 | 0 |
| | E-4 | 0 | 0 | 0 | 2 | 0 | 0 | 0 | 0 | 0 | 0 | 0 |
| Evaluation: Cross-sectional shape | | ○ | ◎ | ○ | ◎ | ○ | ◎ | ○ | ○ | X | X | X |
| Evaluation: Linear thermal expansion coefficient (α) | | ○ | ○ | ○ | ○ | ○ | ○ | ○ | ○ | X | X | X |

B-1 o-naphthoquinonediazidesulfonic acid ester obtained by reacting o-naphthoquinonediazide-5-sulfonic acid with 1-[1-(4-hydroxyphenyl)isopropyl]-4-[1,1-bis(4-hydroxyphenyl)ethyl]benzene
B-2 o-naphthoquinonediazidesulfonic acid ester obtained by reacting o-naphthoquinonediazide-5-sulfonic acid with 2,3,4-trihydroxybenzophenone
C-1 COMPOCERAN SQ-101 (commercially available from Arakawa Chemical Industries, Ltd.)
C-2 COMPOCERAM SQ-102 (commercially available from Arakawa Chemical Industries, Ltd.)
C-3 COMPOCERAM SQ105-7 (commercially available from Arakawa Chemical Industries, Ltd.)
C-4 COMPOCERAM SQ506 (commercially available from Arakawa Chemical Industries, Ltd., no thiol groups)
D-1 propylene glycol monomethyl ether acetate
D-2 diethylene glycol dimethyl ether
D-3 ethyl 3-ethoxypropionate
E-1 SH29PA (Dow Corning Toray silicone Co., Ltd.)
E-2 KBM403 (commercially available from Shietsu Chemical Co., Ltd.)
E-3 UN-3320HS (commercially available from Negami Industry Co., Ltd.)
E-4 bisphenol A diglycidyl ether As shown in Table 2, the photosensitive resin composition of each of Examples 1 to 8 contains the alkali-soluble resin (A), the o-naphthoquinonediazidesulfonic acid ester (B), the silsesquioxane (C) and the solvent (D), and the resulting patterned protective film of each of Application Examples 1 to 8 has a good cross-sectional shape and a low linear thermal expansion coefficient.

Moreover, the photosensitive resin compositions of Examples 2, 4, and 6 further contain the additives (E), such as urethane (meth)acrylate and bisphenol A diglycidyl ether, and the corresponding patterned protective films have better cross-sectional shapes.

Comparative Examples 1 and 2 do not include the silsesquioxane (C) having at least two thiol groups in a molecule, and Comparative Examples 3 includes the silsesquioxane (C) having no thiol group in a molecule. The resulting patterned protective film of each of Comparative Application Examples 1 to 3 has an unsatisfactory cross-sectional shape and a high linear thermal expansion coefficient.

To sum up, the photosensitive resin composition according to this invention includes the alkali-soluble resin (A), the o-naphthoquinonediazidesulfonic acid ester (B), the silsesquioxane (C) and the solvent (D), and the corresponding patterned protective film formed therefrom has a good cross-sectional shape and a low linear thermal expansion coefficient.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A photosensitive resin composition comprising:
   (A) an alkali-soluble resin;
   (B) an o-naphthoquinonediazidesulfonic acid ester;
   (C) a silsesquioxane having at least two thiol groups in a molecule; and
   (D) a solvent;
   wherein said silsesquioxane is obtained by subjecting to condensation a silane material which includes a thiol-group-containing silane represented by formula (I):

$$R^a Si(OR^b)_3 \quad (I),$$

wherein $R^a$ represents a $C_1$-$C_8$ organic group that contains a thiol group and that is free from an aromatic group, or an organic group that contains a thiol group and an aromatic group, and $R^b$ independently represents hydrogen, a $C_1$-$C_6$ alkyl group, a $C_1$-$C_6$ acyl group, or a $C_6$-$C_{15}$ aromatic group, and wherein said alkali-soluble resin (A) is obtained by subjecting a mixture to copolymerization, said mixture containing (a1) at least one of an unsaturated carboxylic acid compound or an unsaturated carboxylic anhydride compound, (a2) an unsaturated compound having an epoxy group, and (a3) an unsaturated compound different from said unsaturated carboxylic acid compound, said unsaturated carboxylic anhydride compound, and said unsaturated compound having an epoxy group.

2. The photosensitive resin composition as claimed in claim 1, wherein said o-naphthoquinonediazidesulfonic acid ester (B) is in an amount ranging from 10 to 50 parts by weight, said silsesquioxane (C) is in an amount ranging from 0.5 to 20 parts by weight, and said solvent (D) is in an amount ranging from 100 to 800 parts by weight based on 100 parts by weight of said alkali-soluble resin (A).

3. The photosensitive resin composition as claimed in claim 1, wherein said silane material further includes a crosslinking agent which is selected from the group consisting of monoalkoxysilane, dialkoxysilane, trialkoxysilane, tetraalkoxysilane, tetraalkoxy titanium, and tetraalkoxy zirconium.

4. A protective film formed from the photosensitive resin composition as claimed in claim 1.

5. An element comprising the protective film as claimed in claim 4.

* * * * *